United States Patent
Smith et al.

(10) Patent No.: US 7,199,384 B2
(45) Date of Patent: *Apr. 3, 2007

(54) INDUCTIVELY-DRIVEN LIGHT SOURCE FOR LITHOGRAPHY

(75) Inventors: Donald K. Smith, Belmont, MA (US); Stephen F. Horne, Chelmsford, MA (US); Matthew M. Besen, Andover, MA (US); Paul A. Blackborow, Cambridge, MA (US)

(73) Assignee: Energetiq Technology Inc., Woburn, MA (US)

( * ) Notice: Subject to any disclaimer, the term of this patent is extended or adjusted under 35 U.S.C. 154(b) by 48 days.

This patent is subject to a terminal disclaimer.

(21) Appl. No.: 10/888,955

(22) Filed: Jul. 9, 2004

(65) Prior Publication Data

US 2006/0006345 A1   Jan. 12, 2006

(51) Int. Cl.
*H01J 35/00* (2006.01)

(52) U.S. Cl. ............. 250/504 R; 378/119; 219/121.57; 313/161

(58) Field of Classification Search ........... 219/121.57; 313/153, 161; 250/504 R; 378/119
See application file for complete search history.

(56) References Cited

U.S. PATENT DOCUMENTS

| | | | |
|---|---|---|---|
| 4,042,848 A | 8/1977 | Lee ........................ | 313/231.6 |
| 4,945,562 A * | 7/1990 | Staub ...................... | 378/130 |
| 5,821,705 A | 10/1998 | Caporaso et al. ......... | 315/507 |
| 6,150,628 A | 11/2000 | Smith et al. ........... | 219/121.54 |
| 6,359,969 B1 | 3/2002 | Shmaenok ............... | 378/156 |
| 6,388,226 B1 | 5/2002 | Smith et al. ........... | 219/121.57 |
| 6,418,874 B1 * | 7/2002 | Cox et al. ............... | 118/723 I |
| 6,421,421 B1 | 7/2002 | McGeoch .................. | 378/119 |
| 6,486,431 B1 | 11/2002 | Smith et al. ........... | 219/121.57 |
| 6,541,786 B1 | 4/2003 | Partlo et al. ............ | 250/504 R |
| 6,552,296 B2 | 4/2003 | Smith et al. ........... | 219/121.43 |
| 6,559,408 B2 | 5/2003 | Smith et al. ........... | 219/121.57 |
| 6,566,668 B2 * | 5/2003 | Rauch et al. ........... | 250/504 R |
| 6,678,037 B2 | 1/2004 | Van Elp et al. ............ | 355/67 |
| 6,804,327 B2 | 10/2004 | Schriever et al. ........... | 378/119 |

(Continued)

FOREIGN PATENT DOCUMENTS

JP        56125882        2/1981

(Continued)

OTHER PUBLICATIONS

Atwood, EUV Source Candidates for Clean, Collectable 13-14 nm Wavelength Radiation, class illustrations for Chapter 6 of Soft X-rays and Extreme Ultraviolet Radiation: Principles and Applications, *Course AST210*, UC Berkeley, (Jan. 2004).

(Continued)

*Primary Examiner*—David Vanore
(74) *Attorney, Agent, or Firm*—Proskauer Rose LLP

(57) ABSTRACT

An apparatus for producing light includes a chamber that has a plasma discharge region and that contains an ionizable medium. The apparatus also includes a magnetic core that surrounds a portion of the plasma discharge region. The apparatus also includes a pulse power system for providing at least one pulse of energy to the magnetic core for delivering power to a plasma formed in the plasma discharge region. The plasma has a localized high intensity zone.

49 Claims, 8 Drawing Sheets

U.S. PATENT DOCUMENTS

| | | | |
|---|---|---|---|
| 6,815,700 B2 | 11/2004 | Melnychuk et al. | 250/504 R |
| 6,826,451 B2 | 11/2004 | del Puerto et al. | 700/245 |
| 6,838,684 B2 | 1/2005 | Bakker et al. | 250/492.2 |
| 6,872,909 B2 * | 3/2005 | Holber et al. | 219/121.52 |
| 6,881,971 B2 | 4/2005 | Ahmad | 250/504 R |
| 6,894,298 B2 | 5/2005 | Ahmad et al. | 250/504 R |
| 2002/0101167 A1 | 8/2002 | Shan et al. | 315/111.11 |
| 2002/0154279 A1 | 10/2002 | Koster et al. | 335/30 |
| 2002/0163313 A1 | 11/2002 | Ness et al. | 315/111.01 |
| 2002/0167282 A1 | 11/2002 | Kirkpatrick et al. | 315/248 |
| 2002/0186814 A1 | 12/2002 | McGeoch | 378/119 |
| 2002/0186815 A1 | 12/2002 | McGeoch | 378/119 |
| 2003/0006383 A1 | 1/2003 | Melnychuk et al. | 250/504 |
| 2003/0057877 A1 | 3/2003 | Kurachi et al. | 315/248 |
| 2003/0068012 A1 | 4/2003 | Ahmad et al. | 378/119 |
| 2003/0222557 A1 | 12/2003 | Kurachi et al. | 313/46 |
| 2004/0036423 A1 | 2/2004 | Lezcano et al. | 315/248 |
| 2004/0108473 A1 | 6/2004 | Melnychuk et al. | 250/504 |

FOREIGN PATENT DOCUMENTS

| | | |
|---|---|---|
| WO | WO 90/13136 A | 11/1990 |

OTHER PUBLICATIONS

Kandlikar, "Heat Transfer Characteristics in Partial Boiling, Fully Developed Boiling, and Significant Void Flow Regions of Subcooled Flow Boiling," *Journal of Heat Transfer* (Feb. 2, 1998) pp. 1-7.

Kaneda et al., "Plasma parameters in noble-gas narrow-tube and capillary-tube discharge, positive column plasma," *J. Phys. D: Appl. Phys*, vol. 23 (1990) pp. 500-503.

Kapteyn, "Compact Coherent EUV Sources", presented at Workshop for users of the Proposed Argonne Linear Free-electron Laser Facility (ALFF), *Argonne National Laboratory*, Argonne, IL (Oct. 30-31, 2003).

Lebert et al., "A gas discharged based radiation source for EUV-lithography," *Microelectronic Engineering*, vol. 46 (1999) pp. 449-452.

Liberman et al., *Physics of High-Density Z-Pinch Plasmas*, Springer-Verlag, New York, (1999) pp. 1-277.

McGeoch, "Progress on the Astron EUV Source," presented at the International SEMATECH 2001 Next Generation Lithography Workshop (Aug. 29, 2001) pp. 1-9.

Mohanty et al., "A novel fast capillary discharge system emitting intense EUV radiation," *Microelectronic Engineeering*, vol. 65 (2003) pp. 47-59.

O'Sullivan et al., "Spectroscopy of a 13.5 nm Laser Plasma Source" *International SEMATECH EUVL Source Workshop* (Oct. 2002) pp. 1-31.

Pouvesle et al., "Discharge-based sources of XUV-X radiations: development and applications," *Plasma Sources Science and Technology* vol. 12 (2003) pp. S43-S50.

Teramoto et al., "High repetition rate MPC generator-driven capillary Z-pinch EUV source," SPIE $29^{th}$ Annual International Symposium on Microlithography, Santa Clara, CA (Feb. 22-27, 2004) pp. 1-23.

Teramoto et al., "Radiation Characteristics of a Capillary Z-Pinch EUV Source," $2^{nd}$ International EUVL Symposium, Antwerp, Belgium (Sep. 30-Oct. 2, 2003) pp. 1-18.

Wheeler et al., "The high-power constricted plasma discharge col. I. Theoretical analysis," *J. Phys. D: Appl. Phys*, vol. 3 (1970) pp. 1374-1380.

Wheeler, "The high-power constricted plasma discharge col. II. Experimental investigation," *J. Phys. D: Appl. Phys*, vol. 4 (1971) pp. 400-408.

Invitation to Pay Additional Fees (Form PCT/ISA/206) for PCT/US2005/024095 (Dec. 21, 2005).

F. Inasaka et al., "Critical heat flux multiplier of subcooled flow boiling for non-uniform heating conditions in a swirl tube," *Fusion Engineering and Design*, vol. 28, 1995, pp. 53-58.

A. Hassanein et al., "Candidate Plasma-Facing Materials for EUV Lithography Source Components," *Emerging Lithographic Technologies VII, Proceedings of the SPIE*, vol. 5037, 2003, pp. 358-369.

M. McGeoch et al., "Star Pinch Scalable EUV Source," *Emerging Lithographic Technologies VII, Proceedings of the SPIE*, vol. 5037, 2003, pp. 141-146.

* cited by examiner

INDUCTIVELY-DRIVEN LIGHT SOURCE FOR LITHOGRAPHY

FIELD OF THE INVENTION

The invention relates to methods and apparatus for generating a plasma, and more particularly, to methods and apparatus for providing an inductively-driven plasma light source for a lithography system.

BACKGROUND OF THE INVENTION

Plasma discharges can be used in a variety of applications. For example, a plasma discharge can be used to excite gases to produce activated gases containing ions, free radicals, atoms and molecules. Plasma discharges also can be used to produce electromagnetic radiation (e.g., light). The electromagnetic radiation produced as a result of a plasma discharge can itself be used in a variety of applications. For example, electromagnetic radiation produced by a plasma discharge can be a source of illumination in a lithography system used in the fabrication of semiconductor wafers. Electromagnetic radiation produced by a plasma discharge can alternatively be used as the source of illumination in microscopy systems, for example, a soft X-ray microscopy system. The parameters (e.g., wavelength and power level) of the light vary widely depending upon the application.

The present state of the art in (e.g., extreme ultraviolet and x-ray) plasma light sources consists of or features plasmas generated by bombarding target materials with high energy laser beams, electrons or other particles or by electrical discharge between electrodes. A large amount of energy is used to generate and project the laser beams, electrons or other particles toward the target materials. Power sources must generate voltages large enough to create electrical discharges between conductive electrodes to produce very high temperature, high density plasmas in a working gas. As a result, however, the plasma light sources generate undesirable particle emissions from the electrodes.

It is therefore a principal object of this invention to provide a plasma source. Another object of the invention is to provide a plasma source that produces minimal undesirable emissions (e.g., particles, infrared light, and visible light). Another object of the invention is to provide a high energy light source.

Another object of the invention is to provide an improved lithography system for semiconductor fabrication. Yet another object of the invention is to provide an improved microscopy system.

SUMMARY OF THE INVENTION

The present invention features a plasma source for generating electromagnetic radiation.

The invention, in one aspect, features a light source. The light source includes a chamber having a plasma discharge region and containing an ionizable medium. The light source also includes a magnetic core that surrounds a portion of the plasma discharge region. The light source also includes a pulse power system for providing at least one pulse of energy to the magnetic core for delivering power to a plasma formed in the plasma discharge region. The plasma has a localized high intensity zone.

The plasma can substantially vary in current density along a path of current flow in the plasma. The zone can be a point source of high intensity light. The zone can be a region where the plasma is pinched to form a neck. The plasma can be a non-uniform plasma. The zone can be created by, for example, gas pressure, an output of the power system, or current flow in the plasma.

The light source can include a feature in the chamber for producing a non-uniformity in the plasma. The feature can be configured to substantially localize an emission of light by the plasma. The feature can be removable or, alternatively, be permanent. The feature can be located remotely relative to the magnetic core. In one embodiment the feature can be a gas inlet for producing a region of higher pressure for producing the zone. In another embodiment the feature can be an insert located in the plasma discharge region. The feature can include a gas inlet. In some embodiments of the invention the feature or insert can include cooling capability for cooling the insert or other portions of the light source. In certain embodiments the cooling capability involves pressurized subcooled flow boiling. The light source also can include a rotating disk that is capable of alternately uncovering the plasma discharge region during operation of the light source. At least one aperture in the disk can be the feature that creates the localized high intensity zone. The rotating disk can include a hollow region for carrying coolant. A thin gas layer can conduct heat from the disk to a cooled surface.

In some embodiments the pulse of energy provided to the magnetic core can form the plasma. Each pulse of energy can possess different characteristics. Each pulse of energy can be provided at a frequency of between about 100 pulses per second and about 15,000 pulses per second. Each pulse of energy can be provided for a duration of time between about 10 ns and about 10 µs. The at least one pulse of energy can be a plurality of pulses.

In yet another embodiment of the invention the pulse power system can include an energy storage device, for example, at least one capacitor and/or a second magnetic core. A second magnetic core can discharge each pulse of energy to the first magnetic core to deliver power to the plasma. The pulse power system can include a magnetic pulse-compression generator, a magnetic switch for selectively delivering each pulse of energy to the magnetic core, and/or a saturable inductor. The magnetic core of the light source can be configured to produce at least essentially a Z-pinch in a channel region located in the chamber or, alternatively, at least a capillary discharge in a channel region in the chamber. The plasma (e.g., plasma loops) can form the secondary of a transformer.

The light source of the present invention also can include at least one port for introducing the ionizable medium into the chamber. The ionizable medium can be an ionizable fluid (i.e., a gas or liquid). The ionizable medium can include one or more gases, for example, one or more of the following gases: Xenon, Lithium, Nitrogen, Argon, Helium, Fluorine, Tin, Ammonia, Stannane, Krypton or Neon. The ionizable medium can be a solid (e.g., Tin or Lithium) that can be vaporized by a thermal process or sputtering process within the chamber or vaporized externally and then introduced into the chamber. The light source also can include an ionization source (e.g., an ultraviolet lamp, an RF source, a spark plug or a DC discharge source) for pre-ionizing the ionizable medium. The ionization source can also be inductive leakage current that flows from a second magnetic core to the magnetic core surrounding the portion of the plasma discharge region.

The light source can include an enclosure that at least partially encloses the magnetic core. The enclosure can define a plurality of holes in the enclosure. A plurality of plasma loops can pass through the plurality of holes when the magnetic core delivers power to the plasma. The enclosure can include two parallel (e.g., disk-shaped) plates. The parallel plates can be conductive and form a primary winding around the magnetic core. The enclosure can, for example, include or be formed from a metal material such as copper, tungsten, aluminum or one of a variety of copper-tungsten alloys. Coolant can flow through the enclosure for cooling a location adjacent the localized high intensity zone.

In some embodiments of the invention the light source can be configured to produce light for different uses. In other embodiments of the invention a light source can be configured to produce light at wavelengths shorter than about 100 nm when the light source generates a plasma discharge. In another embodiment of the invention a light source can be configured to produce light at wavelengths shorter than about 15 nm when the light source generates a plasma discharge. The light source can be configured to generate a plasma discharge suitable for semiconductor fabrication lithographic systems. The light source can be configured to generate a plasma discharge suitable for microscopy systems.

The invention, in another aspect, features an inductively-driven light source.

In another aspect of the invention, a light source features a chamber having a plasma discharge region and containing an ionizable material. The light source also includes a transformer having a first magnetic core that surrounds a portion of the plasma discharge region. The light source also includes a second magnetic core linked with the first magnetic core by a current. The light source also includes a power supply for providing a first signal (e.g., a voltage signal) to the second magnetic core, wherein the second magnetic core provides a second signal (e.g., a pulse of energy) to the first magnetic core when the second magnetic core saturates, and wherein the first magnetic core delivers power to a plasma formed in the plasma discharge region from the ionizable medium in response to the second signal. The light source can include a metallic material for conducting the current.

In another aspect of the invention, a light source includes a chamber having a channel region and containing an ionizable medium. The light source includes a magnetic core that surrounds a portion of the channel region and a pulse power system for providing at least one pulse of energy to the magnetic core for exciting the ionizable medium to form at least essentially a Z-pinch in the channel region. The current density of the plasma can be greater than about 1 KA/cm². The pressure in the channel region can be less than about 100 mTorr.

In yet another aspect of the invention, a light source includes a chamber containing a light emitting plasma with a localized high-intensity zone that emits a substantial portion of the emitted light. The light source also includes a magnetic core that surrounds a portion of the non-uniform light emitting plasma. The light source also includes a pulse power system for providing at least one pulse of energy to the magnetic core for delivering power to the plasma.

In another aspect of the invention, a light source includes a chamber having a plasma discharge region and containing an ionizable medium. The light source also includes a magnetic core that surrounds a portion of the plasma discharge region. The light source also includes a means for providing at least one pulse of energy to the magnetic core for delivering power to a plasma formed in the plasma discharge region. The plasma has a localized high intensity zone.

In another aspect of the invention, a plasma source includes a chamber having a plasma discharge region and containing an ionizable medium. The plasma source also includes a magnetic core that surrounds a portion of the plasma discharge region and induces an electric current in the plasma sufficient to form a Z-pinch.

In general, in another aspect the invention relates to a method for generating a light signal. The method involves introducing an ionizable medium capable of generating a plasma into a chamber. The also involves applying at least one pulse of energy to a magnetic core that surrounds a portion of a plasma discharge region within the chamber such that the magnetic core delivers power to the plasma. The plasma has a localized high intensity zone.

The method for generating the light signal can involve producing a non-uniformity in the plasma. The method also can involve localizing an emission of light by the plasma. The method also can involve producing a region of higher pressure to produce the non-uniformity.

The plasma can be a non-uniform plasma. The plasma can substantially vary in current density along a path of current flow in the plasma. The zone can be a point source of high intensity light. The zone can be a region where the plasma is pinched to form a neck. The zone can be created with a feature in the chamber. The zone can be created with gas pressure. The zone can be created with an output of the power system. Current flow in the plasma can create the zone.

The method also can involve locating an insert in the plasma discharge region. The insert can define a necked region for localizing an emission of light by the plasma. The insert can include a gas inlet and/or cooling capability. A non-uniformity can be produced in the plasma by a feature located in the chamber. The feature can be configured to substantially localize an emission of light by the plasma. The feature can be located remotely relative to the magnetic core.

The at least one pulse of energy provided to the magnetic core can form the plasma. Each pulse of energy can be pulsed at a frequency of between about 100 pulses per second and about 15,000 pulses per second. Each pulse of energy can be provided for a duration of time between about 10 ns and about 10 µs. The pulse power system can an energy storage device, for example, at least one capacitor and/or a second magnetic core.

In some embodiments, the method of the invention can involve discharging the at least one pulse of energy from the second magnetic core to the first magnetic core to deliver power to the plasma. The pulse power system can include, for example, a magnetic pulse-compression generator and/or a saturable inductor. The method can involve delivering each pulse of energy to the magnetic core by operation of a magnetic switch.

In some embodiments, the method of the invention can involve producing at least essentially a Z-pinch or essentially a capillary discharge in a channel region located in the chamber. In some embodiments the method can involve introducing the ionizable medium into the chamber via at least one port. The ionizable medium can include one or more gases, for example, one or more of the following gases: Xenon, Lithium, Nitrogen, Argon, Helium, Fluorine, Tin, Ammonia, Stannane, Krypton or Neon. The method also can involve pre-ionizing the ionizable medium with an ionization source (e.g., an ultraviolet lamp, an RF source, a spark plug or a DC discharge source). Alternatively or additionally, inductive leakage current flowing from a second magnetic core to the magnetic core surrounding the portion of the plasma discharge region can be used to pre-ionize the ionizable medium. In another embodiment, the ionizable medium can be a solid (e.g., Tin or Lithium) that can be vaporized by a thermal process or sputtering process within the chamber or vaporized externally and then introduced into the chamber.

In another embodiment of the invention the method can involve at least partially enclosing the magnetic core within an enclosure. The enclosure can include a plurality of holes. A plurality of plasma loops can pass through the plurality of holes when the magnetic core delivers power to the plasma. The enclosure can include two parallel plates. The two parallel plates can be used to form a primary winding around the magnetic core. The enclosure can include or be formed from a metal material, for example, copper, tungsten, aluminum or copper-tungsten alloys. Coolant can be provided to the enclosure to cool a location adjacent the localized high intensity location.

The method can involve alternately uncovering the plasma discharge region. A rotating disk can be used to alternately uncover the plasma discharge region and alternately define a feature that creates the localized high intensity zone. A coolant can be provided to a hollow region in the rotating disk.

In another embodiment the method can involve producing light at wavelengths shorter than about 100 nm. In another embodiments the method can involve producing light at wavelengths shorter than about 15 nm. The method also can involve generating a plasma discharge suitable for semiconductor fabrication lithographic systems. The method also can involve generating a plasma discharge suitable for microscopy systems.

The invention, in another aspect, features a lithography system. The lithography system includes at least one light collection optic and at least one light condenser optic in optical communication with the at least one collection optic. The lithography system also includes a light source capable of generating light for collection by the at least one collection optic. The light source includes a chamber having a plasma discharge region and containing an ionizable medium. The light source also includes a magnetic core that surrounds a portion of the plasma discharge region and a pulse power system for providing at least one pulse of energy to the magnetic core for delivering power to a plasma formed in the plasma discharge region. The plasma has a localized high intensity zone.

In some embodiments of the invention, light emitted by the plasma is collected by the at least one collection optic, condensed by the at least one condenser optic and at least partially directed through a lithographic mask.

The invention, in another aspect, features an inductively-driven light source for illuminating a semiconductor wafer in a lithography system.

In general, in another aspect the invention relates to a method for illuminating a semiconductor wafer in a lithography system. The method involves introducing an ionizable medium capable of generating a plasma into a chamber. The method also involves applying at least one pulse of energy to a magnetic core that surrounds a portion of a plasma discharge region within the chamber such that the magnetic core delivers power to the plasma. The plasma has a localized high intensity zone. The method also involves collecting light emitted by the plasma, condensing the collected light; and directing at least part of the condensed light through a mask onto a surface of a semiconductor wafer.

The invention, in another aspect, features a microscopy system. The microscopy system includes a first optical element for collecting light and a second optical element for projecting an image of a sample onto a detector. The detector is in optical communication with the first and second optical elements. The microscopy system also includes a light source in optical communication with the first optical element. The light source includes a chamber having a plasma discharge region and containing an ionizable medium. The light source also includes a magnetic core that surrounds a portion of the plasma discharge region and a pulse power system for providing at least one pulse of energy to the magnetic core for delivering power to a plasma formed in the plasma discharge region. The plasma has a localized high intensity zone.

In some embodiments of the invention, light emitted by the plasma is collected by the first optical element to illuminate the sample and the second optical element projects an image of the sample onto the detector.

In general, in another aspect the invention relates to a microscopy method. The method involves introducing an ionizable medium capable of generating a plasma into a chamber. The method also involves applying at least one pulse of energy to a magnetic core that surrounds a portion of a plasma discharge region within the chamber such that the magnetic core delivers power to the plasma. The plasma has a localized high intensity zone. The method also involves collecting a light emitted by the plasma with a first optical element and projecting it through a sample. The method also involves projecting the light emitted through the sample to a detector.

The foregoing and other objects, aspects, features, and advantages of the invention will become more apparent from the following description and from the claims.

BRIEF DESCRIPTION OF THE DRAWINGS

The foregoing and other objects, feature and advantages of the invention, as well as the invention itself, will be more fully understood from the following illustrative description, when read together with the accompanying drawings which are not necessarily to scale.

DETAILED DESCRIPTION OF ILLUSTRATIVE EMBODIMENTS

Figure 1:
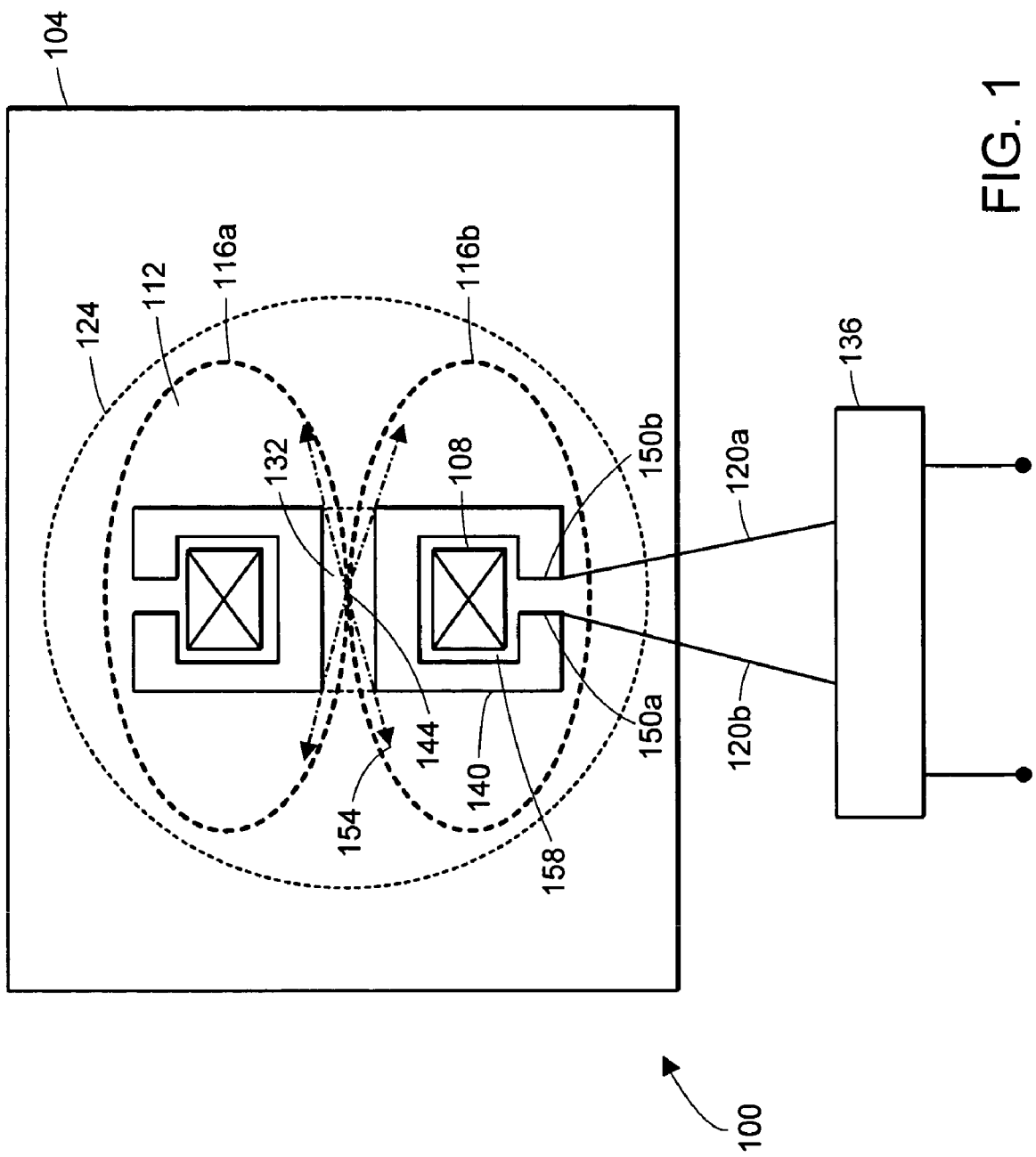
FIG. 1 is a cross-sectional view of a magnetic core surrounding a portion of a plasma discharge region, according to an illustrative embodiment of the invention.

FIG. 1 is a cross-sectional view of a plasma source 100 for generating a plasma that embodies the invention. The plasma source 100 includes a chamber 104 that defines a plasma discharge region 112. The chamber 104 contains an ionizable medium that is used to generate a plasma (shown as two plasma loops 116a and 116b) in the plasma discharge region 112. The plasma source 100 includes a transformer 124 that induces an electric current into the two plasma loops 116a and 116b (generally 116) formed in the plasma discharge region 112. The transformer 124 includes a magnetic core 108 and a primary winding 140. A gap 158 is located between the winding 140 and the magnetic core 108.

In this embodiment, the winding 140 is a copper enclosure that at least partially encloses the magnetic core 108 and that provides a conductive path that at least partially encircles the magnetic core 108. The copper enclosure is electrically equivalent to a single turn winding that encircles the magnetic core 108. In another embodiment, the plasma source 100 instead includes an enclosure that at least partially encloses the magnetic core 108 in the chamber 104 and a separate metal (e.g., copper or aluminum) strip that at least partially encircles the magnetic core 108. In this embodiment, the metal strip is located in the gap 158 between the enclosure and the magnetic core 108 and is the primary winding of the magnetic core 108 of the transformer 124.

The plasma source 100 also includes a power system 136 for delivering energy to the magnetic core 108. In this embodiment, the power system 136 is a pulse power system that delivers at least one pulse of energy to the magnetic core 108. In operation, the power system 136 typically delivers a series of pulses of energy to the magnetic core 108 for delivering power to the plasma. The power system 136 delivers pulses of energy to the transformer 124 via electrical connections 120a and 120b (generally 120). The pulses of energy induce a flow of electric current in the magnetic core 108 that delivers power to the plasma loops 116a and 116b in the plasma discharge region 112. The magnitude of the power delivered to the plasma loops 116a and 116b depends on the magnetic field produced by the magnetic core 108 and the frequency and duration of the pulses of energy delivered to the transformer 124 according to Faraday's law of induction.

In some embodiments, the power system 136 provides pulses of energy to the magnetic core 108 at a frequency of between about 1 pulse and about 50,000 pulses per second. In certain embodiments, the power system 136 provides pulses of energy to the magnetic core 108 at a frequency of between about 100 pulses and 15,000 pulses per second. In certain embodiments, the pulses of energy are provide to the magnetic core 108 for a duration of time between about 10 ns and about 10 µs. The power system 136 may include an energy storage device (e.g., a capacitor) that stores energy prior to delivering a pulse of energy to the magnetic core 108. In some embodiments, the power system 136 includes a second magnetic core. In certain embodiments, the second magnetic core discharges pulses of energy to the first magnetic core 108 to deliver power to the plasma. In some embodiments, the power system 136 includes a magnetic pulse-compression generator and/or a saturable inductor. In other embodiments, the power system 136 includes a magnetic switch for selectively delivering the pulse of energy to the magnetic core 108. In certain embodiments, the pulse of energy can be selectively delivered to coincide with a predefined or operator-defined duty cycle of the plasma source 100. In other embodiments, the pulse of energy can be delivered to the magnetic core when, for example, a saturable inductor becomes saturated.

The plasma source 100 also may include a means for generating free charges in the chamber 104 that provides an initial ionization event that pre-ionizes the ionizable medium to ignite the plasma loops 116a and 116b in the chamber 104. Free charges can be generated in the chamber by an ionization source, such as, an ultraviolet light, an RF source, a spark plug or a DC discharge source. Alternatively or additionally, inductive leakage current flowing from a second magnetic core in the power system 136 to the magnetic core 108 can pre-ionize the ionizable medium. In certain embodiments, the ionizable medium is pre-ionized by one or more ionization sources.

The ionizable medium can be an ionizable fluid (i.e., a gas or liquid). By way of example, the ionizable medium can be a gas, such as Xenon, Lithium, Tin, Nitrogen, Argon, Helium, Fluorine, Ammonia, Stannane, Krypton or Neon. Alternatively, the ionizable medium can be finely divided particle (e.g., Tin) introduced through at least one gas port into the chamber 104 with a carrier gas, such as helium. In another embodiment, the ionizable medium can be a solid (e.g., Tin or Lithium) that can be vaporized by a thermal process or sputtering process within the chamber or vaporized externally and then introduced into the chamber 104. In certain embodiments, the plasma source 100 includes a vapor generator (not shown) that vaporizes the metal and introduces the vaporized metal into the chamber 104. In certain embodiments, the plasma source 100 also includes a heating module for heating the vaporized metal in the chamber 104. The chamber 104 may be formed, at least in part, from a metallic material such as copper, tungsten, a copper-tungsten alloy or any material suitable for containing the ionizable medium and the plasma and for otherwise supporting the operation of the plasma source 100.

Referring to FIG. 1, the plasma loops 116a and 116b converge in a channel region 132 defined by the magnetic core 108 and the winding 140. In one exemplary embodiment, pressure in the channel region is less than about 100 mTorr. Energy intensity varies along the path of a plasma loop if the cross-sectional area of the plasma loop varies along the length of the plasma loop. Energy intensity may therefore be altered along the path of a plasma loop by use of features or forces that alter cross-sectional area of the plasma loop. Altering the cross-sectional area of a plasma loop is also referred to herein as constricting the flow of current in the plasma or pinching the plasma loop. Accordingly, the energy intensity is greater at a location along the path of the plasma loop where the cross-sectional area is decreased. Similarly, the energy intensity is lower at a given point along the path of the plasma loop where the cross-sectional area is increased. It is therefore possible to create locations with higher or lower energy intensity.

Constricting the flow of current in a plasma is also sometimes referred to as producing a Z-pinch or a capillary discharge. A Z-pinch in a plasma is characterized by the plasma decreasing in cross-sectional area at a specific location along the path of the plasma. The plasma decreases in cross-sectional area as a result of the current that is flowing through the cross-sectional area of the plasma at the specific location. Generally, a magnetic field is generated due to the current in the plasma and, the magnetic field confines and compresses the plasma. In this case, the plasma carries an induced current along the plasma path and a resulting magnetic field surrounds and compresses the plasma. This effect is strongest where the cross-sectional area of the plasma is minimum and works to further compress the cross-sectional area, hence further increasing the current density in the plasma.

In one embodiment, the channel 132 is a region of decreased cross-sectional area relative to other locations along the path of the plasma loops 116a and 116b. As such, the energy intensity is increased in the plasma loops 116a and 116b within the channel 132 relative to the energy intensity in other locations of the plasma loops 116a and 116b. The increased energy intensity increases the emitted electromagnetic energy (e.g., emitted light) in the channel 132.

The plasma loops 116a and 116b also have a localized high intensity zone 144 as a result of the increased energy intensity. In certain embodiments, a high intensity light 154 is produced in and emitted from the zone 144 due to the increased energy intensity. Current density substantially varies along the path of the current flow in the plasma loops 116a and 116b. In one exemplary embodiment, the current density of the plasma is in the localized high intensity zone is greater than about 1 KA/cm$^2$. In some embodiments, the zone 144 is a point source of high intensity light and is a region where the plasma loops 116a and 116b are pinched to form a neck.

In some embodiments, a feature is located in the chamber 104 that creates the zone 144. In certain embodiments, the feature produces a non-uniformity in the plasma loops 116a and 116b. The feature is permanent in some embodiments and removable in other embodiments. In some embodiments, the feature is configured to substantially localize an emission of light by the plasma loops 116a and 116b to, for example, create a point source of high intensity electromagnetic radiation. In other embodiments, the feature is located remotely relative to the magnetic core 108. In certain embodiments, the remotely located feature creates the localized high intensity zone in the plasma in a location remote to the magnetic core 108 in the chamber 104. For example, the disk 308 of FIG. 3 discussed later herein is located remotely relative to the magnetic core 108. In certain embodiment, a gas inlet is located remotely from the magnetic core to create a region of higher pressure to create a localized high intensity zone.

In some embodiments, the feature is an insert that defines a necked region. In certain embodiments, the insert localizes an emission of light by the plasma in the necked region. In certain other embodiments, the insert includes a gas inlet for, for example, introducing the ionizable medium into the chamber 104. In other embodiments, the feature includes cooling capability for cooling a region of the feature. In certain embodiments, the cooling capability involves subcooled flow boiling as described by, for example, S. G. Kandlikar "*Heat Transfer Characteristics in Partial Boiling, Fully Developed Boling, and Significant Void Flow Regions of Subcooled Flow Boiling*" Journal of Heat Transfer Feb. 2, 1998. In certain embodiments, the cooling capability involves pressurized subcooled flow boiling. In other embodiments, the insert includes cooling capability for cooling a region of the insert adjacent to, for example, the zone 144.

In some embodiments, gas pressure creates the localized high intensity zone 144 by, for example, producing a region of higher pressure at least partially around a portion of the plasma loops 116a and 116b. The plasma loops 116a and 116b are pinched in the region of high pressure due to the increased gas pressure. In certain embodiments, a gas inlet is the feature that introduces a gas into the chamber 104 to increase gas pressure. In yet another embodiment, an output of the power system 136 can create the localized high intensity zone 144 in the plasma loops 116a and 116b.

Figure 2:
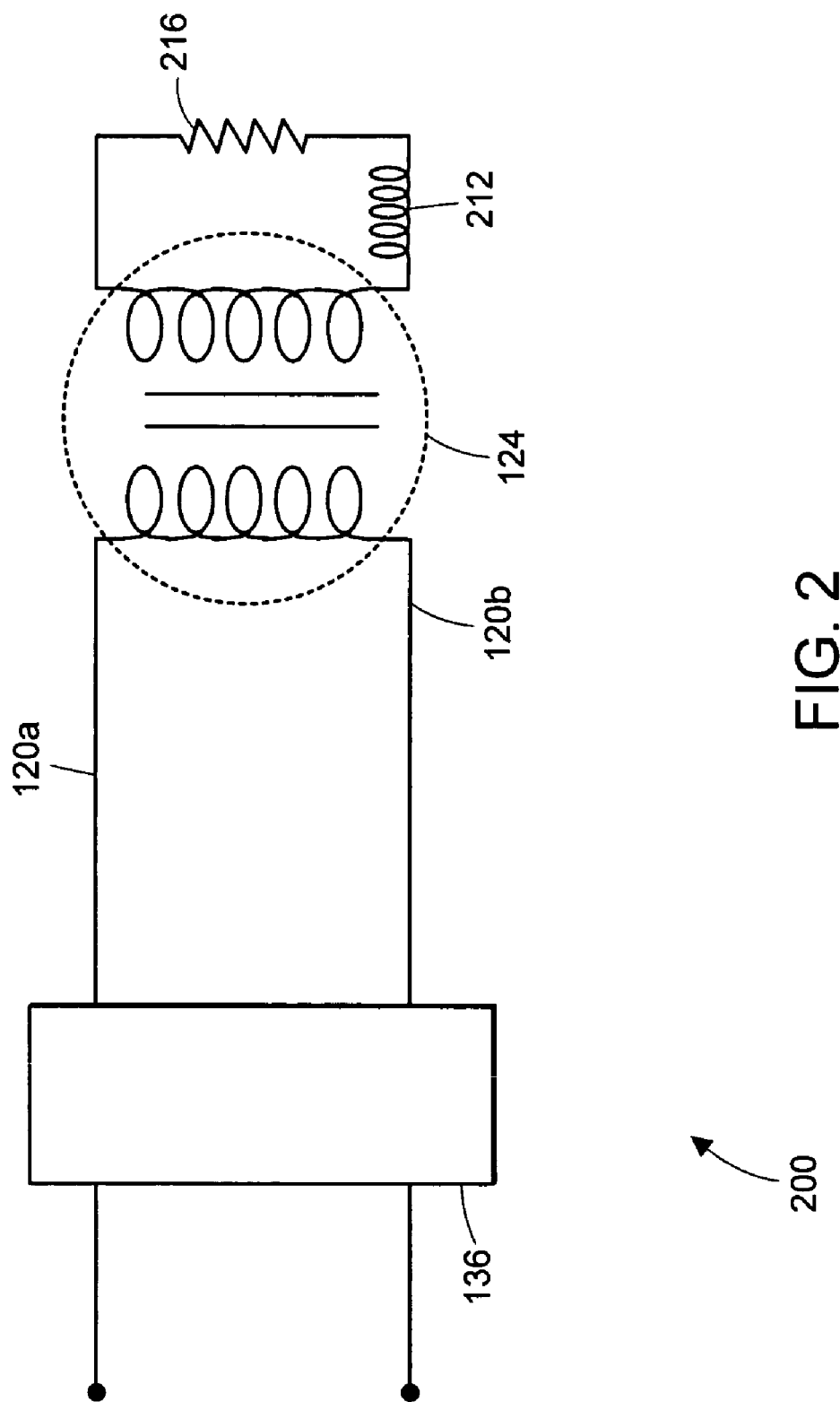
FIG. 2 is a schematic electrical circuit model of a plasma source, according to an illustrative embodiment of the invention.

FIG. 2 is a schematic electrical circuit model 200 of a plasma source, for example the plasma source 100 of FIG. 1. The model 200 includes a power system 136, according to one embodiment of the invention. The power system 136 is electrically connected to a transformer, such as the transformer 124 of FIG. 1. The model 200 also includes an inductive element 212 that is a portion of the electrical inductance of the plasma, such as the plasma loops 116a and 116b of FIG. 1. The model 200 also includes a resistive element 216 that is a portion of the electrical resistance of the plasma, such as the plasma loops 116a and 116b of FIG. 1. In this embodiment, the power system is a pulse power system that delivers via electrical connections 120a and 120b a pulse of energy to the transformer 124. The pulse of energy is then delivered to the plasma by, for example, a magnetic core which is a component of the transformer, such as the magnetic core 108 of the transformer 124 of FIG. 1.

Figures 3A, 3B:
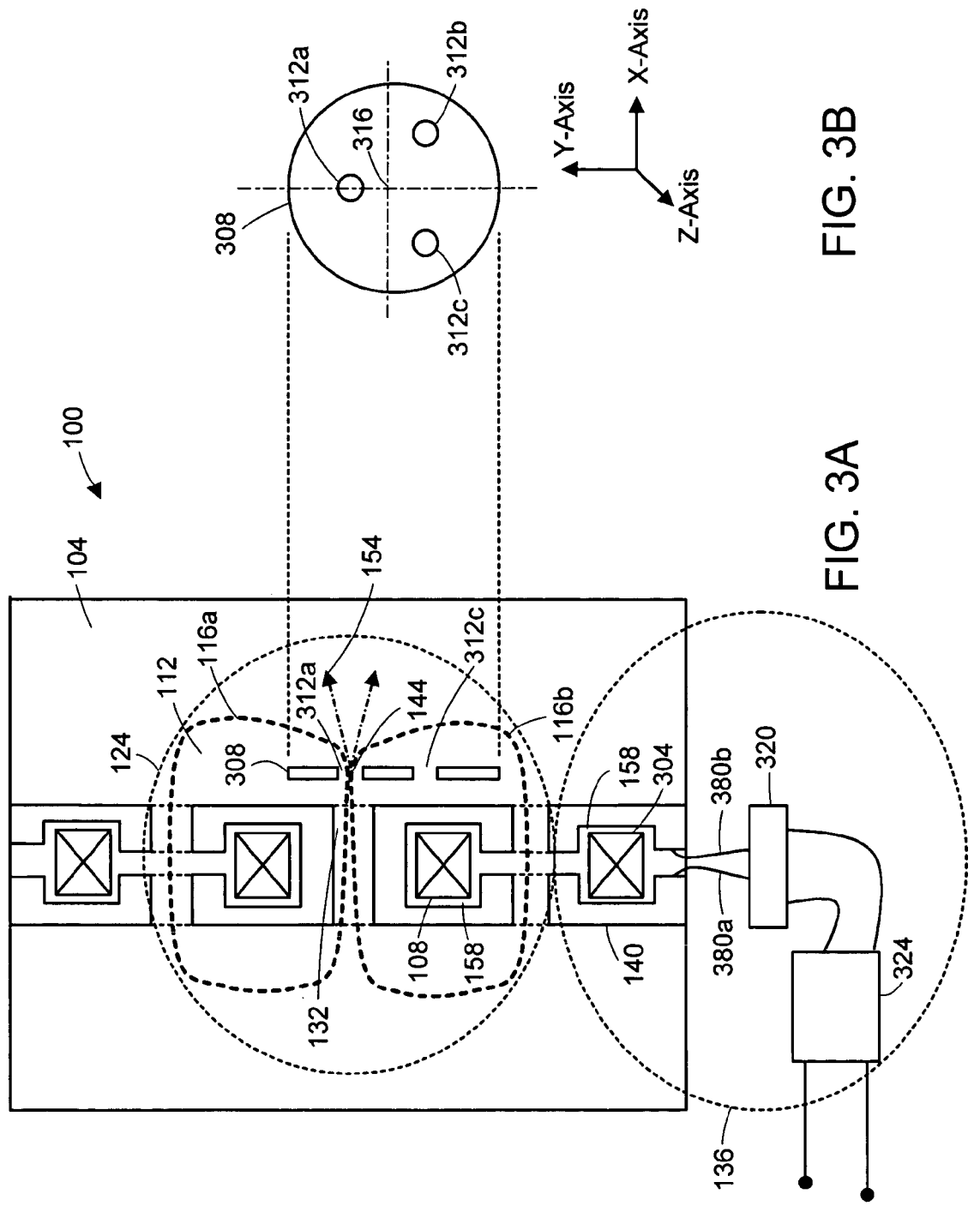
FIG. 3 is a cross-sectional view of two magnetic cores and a feature for producing a non-uniformity in a plasma, according to another illustrative embodiment of the invention.

In another embodiment, illustrated in FIGS. 3A and 3B, the plasma source 100 includes a chamber 104 that defines a plasma discharge region 112. The chamber 104 contains an ionizable medium that is used to generate a plasma in the plasma discharge region 112. The plasma source 100 includes a transformer 124 that couples electromagnetic energy into two plasma loops 116a and 116b (generally 116) formed in the plasma discharge region 112. The transformer 124 includes a first magnetic core 108. The plasma source 100 also includes a winding 140. In this embodiment, the winding 140 is an enclosure for locating the magnetic cores 108 and 304 in the chamber 104. The winding 104 is also a primary winding of magnetic core 108 and a winding for magnetic core 304.

The winding 140 around the first magnetic core 108 forms the primary winding of the transformer 124. In this embodiment, the second magnetic core and the winding 140 are part of the power system 136 and form a saturable inductor that delivers a pulse of energy to the first magnetic core 108. The power system 136 includes a capacitor 320 that is electrically connected via connections 380a and 380b to the winding 140. In certain embodiments, the capacitor 320 stores energy that is selectively delivered to the first magnetic core 108. A voltage supply 324, which may be a line voltage supply or a bus voltage supply, is coupled to the capacitor 320.

The plasma source 100 also includes a disk 308 that creates a localized high intensity zone 144 in the plasma loops 116a and 116b. In this embodiment, the disk 308 is located remotely relative to the first magnetic core 108. The disk 308 rotates around the Z-axis of the disk 308 (referring to FIG. 3B) at a point of rotation 316 of the disk 308. The disk 308 has three apertures 312a, 312b and 312c (generally 312) that are located equally angularly spaced around the disk 308. The apertures 312 are located in the disk 308 such that at any angular orientation of the disk 308 rotated around the Z-Axis only one (e.g., aperture 312a in FIGS. 3A and 3B) of the three apertures 312a, 312b and 312c is aligned with the channel 132 located within the core 108. In this manner, the disk 308 can be rotated around the Z-axis such that the channel 132 may be alternately uncovered (e.g., when aligned with an aperture 312) and covered (e.g., when not aligned with an aperture 312). The disk 308 is configured to pinch (i.e., decrease the cross-sectional area of) the two plasma loops 116a and 116b in the aperture 312a. In this manner, the apertures 312 are features in the disk of the plasma source 100 that create the localized high intensity zone 144 in the plasma loops 316a and 316b. By pinching the two plasma loops 116a and 116b in the location of the aperture 312a the energy intensity of the two plasma loops 116a and 116b in the location of the aperture 312a is greater than the energy intensity in a cross-section of the plasma loops 116a and 116b in other locations along the current paths of the plasma loops 116a and 116b.

It is understood that variations on, for example, the geometry of the disk 308 and the number and or shape of the apertures 312 is contemplated by the description herein. In one embodiment, the disk 308 is a stationary disk having at least one aperture 312. In some embodiments, the disk 308 has a hollow region (not shown) for carrying coolant to cool a region of the disk 308 adjacent the localized high intensity zone 144. In some embodiments, the plasma source 100 includes a thin gas layer that conducts heat from the disk 308 to a cooled surface in the chamber 104.

Figure 4:
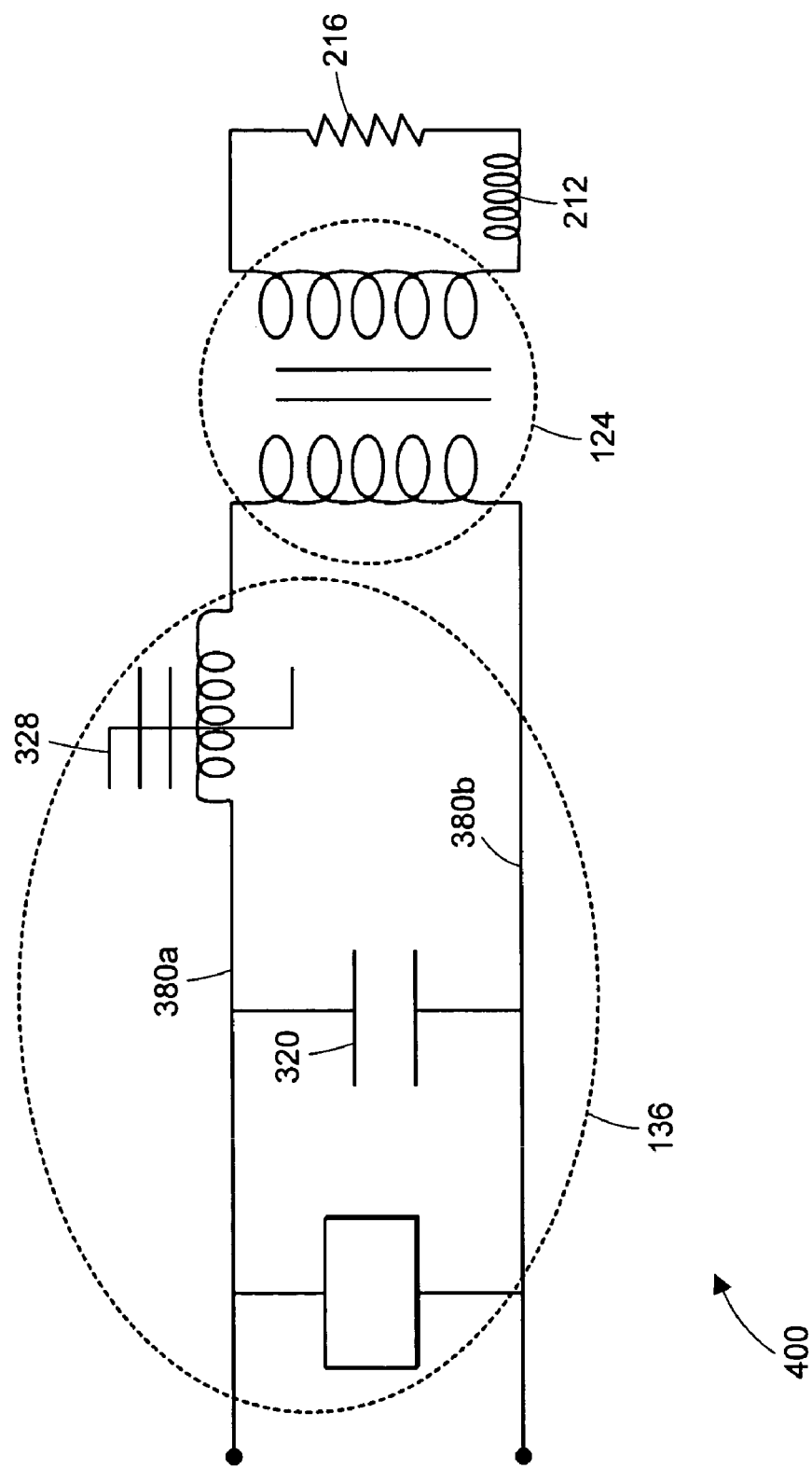
FIG. 4 is a schematic electrical circuit model of a plasma source, according to an illustrative embodiment of the invention.

FIG. 4 illustrates an electrical circuit model 400 of a plasma source, such as the plasma source 100 of FIG. 3. The model 400 includes a power system 136 that is electrically connected to a transformer, such as the transformer 124 of FIG. 3. The model 400 also includes an inductive element 212 that is a portion of the electrical inductance of the plasma. The model 400 also includes a resistive element 216 that is a portion of the resistance of the plasma. A pulse power system 136 delivers via electrical connections 380a and 380b pulses of energy to the transformer 124. The power system 136 includes a voltage supply 324 that charges the capacitor 320. The power system 136 also includes a saturable inductor 328 which is a magnetic switch that delivers energy stored in the capacitor 320 to the first magnetic core 108 when the inductor 328 becomes saturated.

In some embodiments, the capacitor 320 is a plurality of capacitors that are connected in parallel. In certain embodiments, the saturable inductor 328 is a plurality of saturable inductors that form, in part, a magnetic pulse-compression generator. The magnetic pulse-compression generator compresses the pulse duration of the pulse of energy that is delivered to the first magnetic core 108.

Figure 5A:
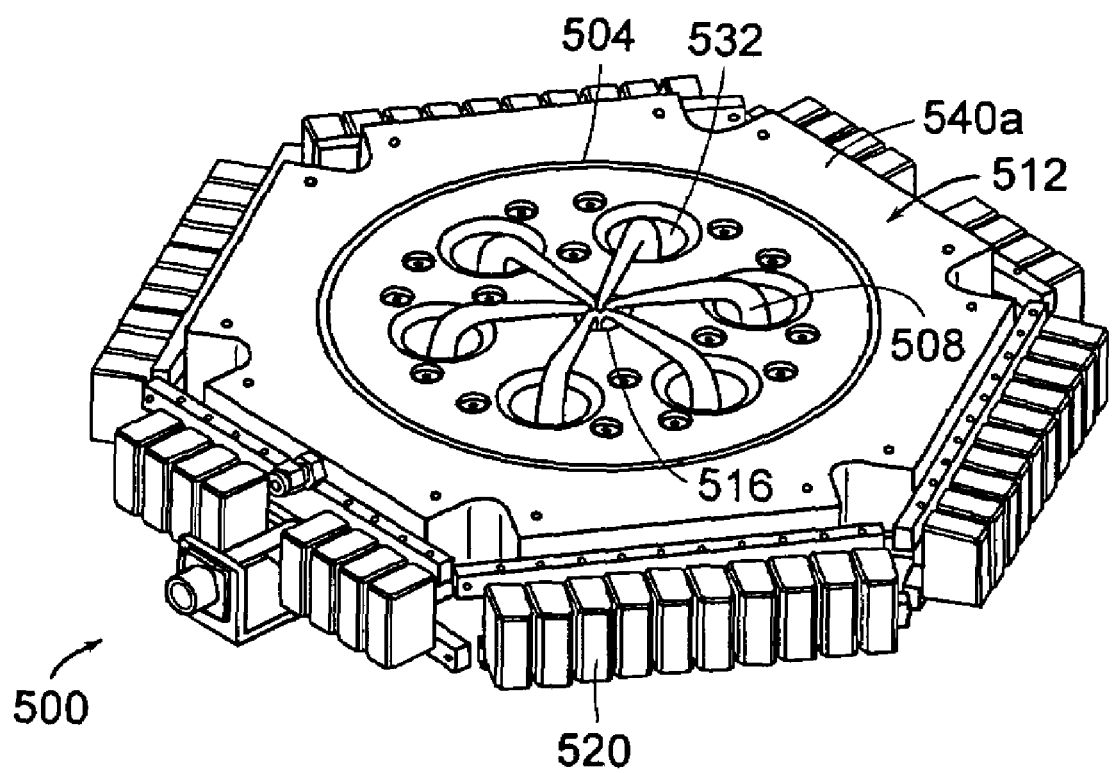
FIG. 5A is an isometric view of a plasma source, according to an illustrative embodiment of the invention.
Figure 5B:
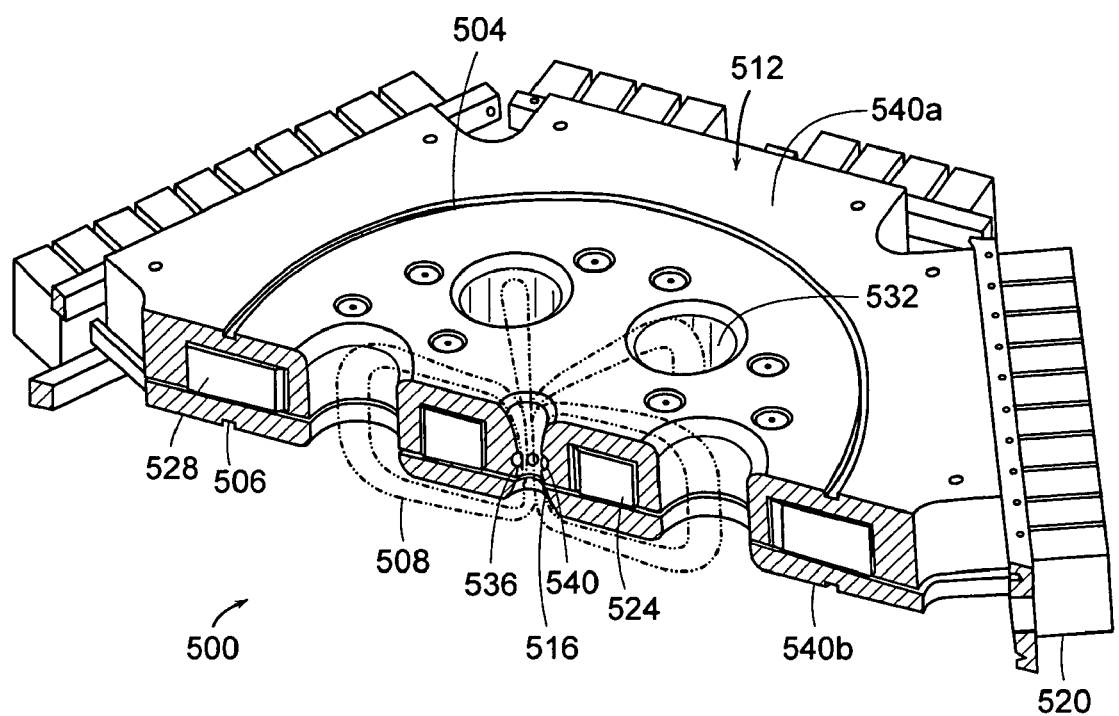
FIG. 5B is a cutaway view of the plasma source of FIG. 5A.

In another embodiment, illustrated in FIGS. 5A and 5B, a portion of a plasma source 500 includes an enclosure 512 that, at least, partially encloses a first magnetic core 524 and a second magnetic core 528. In this embodiment, the enclosure 512 has two conductive parallel plates 540a and 540b that form a conductive path at least partially around the first magnetic core 524 and form a primary winding around the first magnetic core 524 of a transformer, such as the transformer 124 of FIG. 4. The parallel plates 540a and 540b also form a conductive path at least partially around the second magnetic core 528 forming an inductor, such as the inductor 328 of FIG. 4. The plasma source 500 also includes a plurality of capacitors 520 located around the outer circumference of the enclosure 512. By way of example, the capacitors 520 can be the capacitor 320 of FIG. 4.

The enclosure 512 defines at least two holes 516 and 532 that pass through the enclosure 512. In this embodiment, there are six holes 532 that are located equally angularly spaced around a diameter of the plasma source 500. Hole 516 is a single hole through the enclosure 512. In one embodiment, the six plasma loops 508 each converge and pass through the hole 516 as a single current carrying plasma path. The six plasma loops also each pass through one of the six holes 532. The parallel plates 540a and 540b have a groove 504 and 506, respectively. The grooves 504 and 506 each locate an annular element (not shown) for creating a pressurized seal and for defining a chamber, such as the chamber 104 of FIG. 3, which encloses the plasma loops 508 during operation of the plasma source 500.

The hole 516 in the enclosure defines a necked region 536. The necked region 536 is a region of decreased cross-section area relative to other locations along the length of the hole 516. As such, the energy intensity is increased in the plasma loops 508, at least, in the necked region 536 forming a localized high intensity zone in the plasma loops 508 in the necked region 536. In this embodiment, there also are a series of holes 540 located in the necked region 536. The holes 540 may be, for example, gas inlets for introducing the ionizable medium into the chamber of the plasma source 500. In other embodiments, the enclosure 512 includes a coolant passage (not shown) for flowing coolant through the enclosure for cooling a location of the enclosure 512 adjacent the localized high intensity zone.

Figure 6:
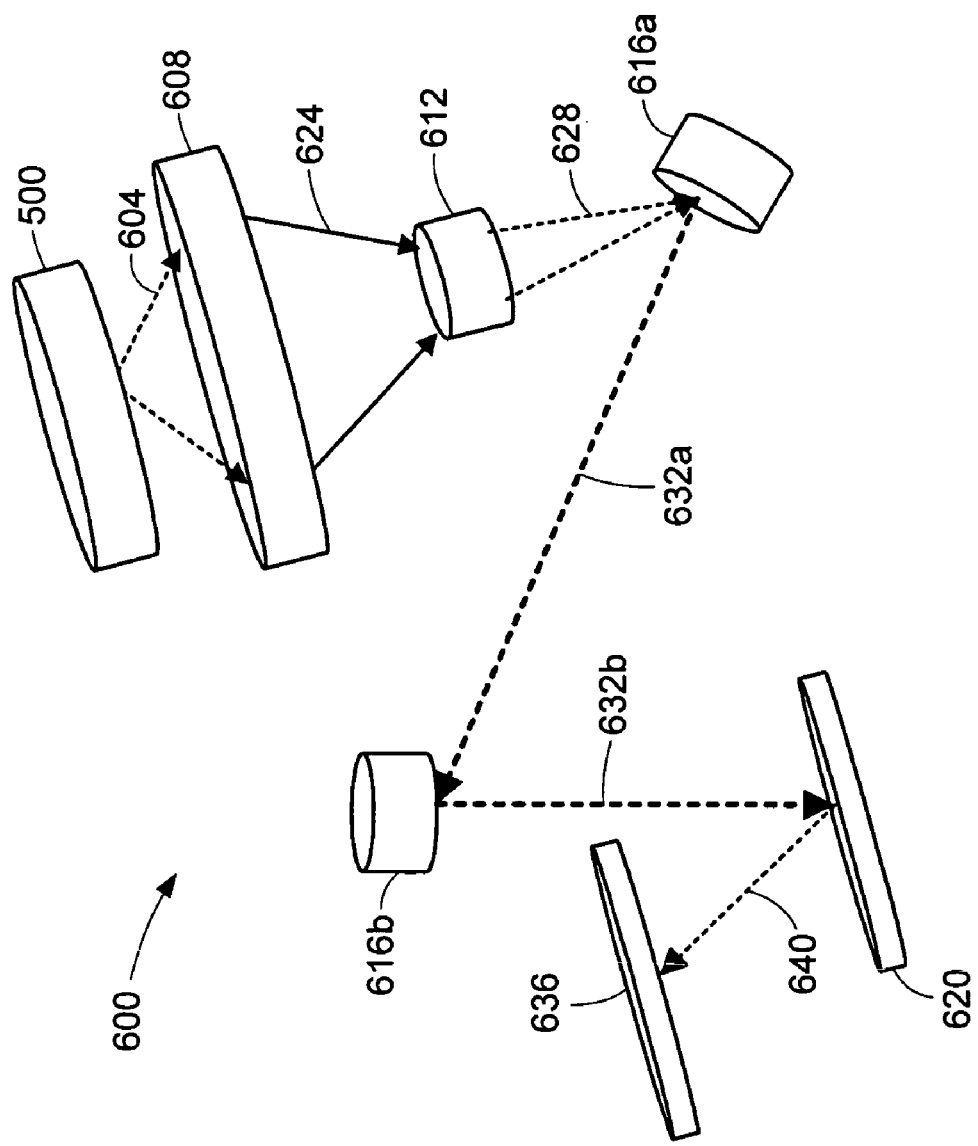
FIG. 6 is a schematic block diagram of a lithography system, according to an illustrative embodiment of the invention.

FIG. 6 is a schematic block diagram of a lithography system 600 that embodies the invention. The lithography system 600 includes a plasma source, such as the plasma source 500 of FIGS. 5A and 5B. The lithography system 600 also includes at least one light collection optic 608 that collects light 604 emitted by the plasma source 500. By way of example, the light 604 is emitted by a localized high intensity zone in the plasma of the plasma source 500. In one embodiment, the light 604 produced by the plasma source 500 is light having a wavelength shorter than about 15 nm for processing a semiconductor wafer 636. The light collection optic 608 collects the light 604 and directs collected light 624 to at least one light condenser optic 612. In this embodiment, the light condenser optic 624 condenses (i.e., focuses) the light 624 and directs condensed light 628 towards mirror 616a (generally 616) which directs reflected light 632a towards mirror 616b which, in turn, directs reflected light 632b towards a reflective lithographic mask 620. Light reflecting off the lithographic mask 620 (illustrated as the light 640) is directed to the semiconductor wafer 636 to, for example, produce at least a portion of a circuit image on the wafer 636. Alternatively, the lithographic mask 620 can be a transmissive lithographic mask in which the light 632b, instead, passes through the lithographic mask 620 and produces a circuit image on the wafer 636.

In an exemplary embodiment, a lithography system, such as the lithography system 600 of FIG. 6 produces a circuit image on the surface of the semiconductor wafer 636. The plasma source 500 produces plasma at a pulse rate of about 10,000 pulses per second. The plasma has a localized high intensity zone that is a point source of pulses of high intensity light 604 having a wavelength shorter than about 15 nm. Collection optic 608 collects the light 604 emitted by the plasma source 500. The collection optic 608 directs the collected light 624 to light condenser optic 612. The light condenser optic 624 condenses (i.e., focuses) the light 624 and directs condensed light 628 towards mirror 616a (generally 616) which directs reflected light 632a towards mirror 616b which, in turn, directs reflected light 632b towards a reflective lithographic mask 620. The mirrors 616a and 616b are multilayer optical elements that reflect wavelengths of light in a narrow wavelength band (e.g., between about 5 nm and about 20 nm). The mirrors 616a and 616b, therefore, transmit light in that narrow band (e.g., light having a low infrared light content).

Figure 7:
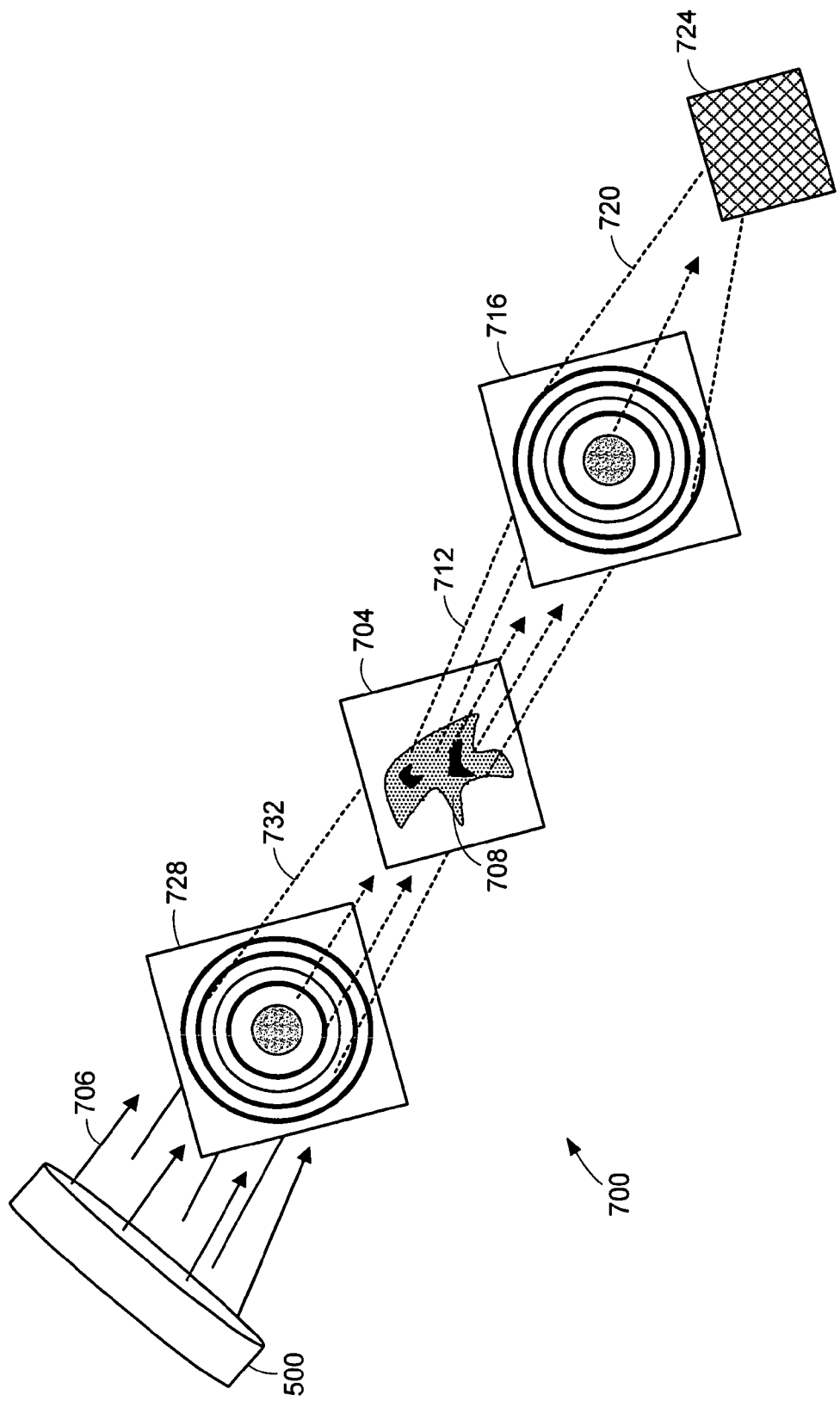
FIG. 7 is a schematic block diagram of a microscopy system, according to an illustrative embodiment of the invention.

FIG. 7 is a schematic block diagram of a microscopy system 700 (e.g., a soft X-ray microscopy system) that embodies the invention. The microscopy system 700 includes a plasma source, such as the plasma source 500 of FIGS. 5A and 5B. The microscopy system 700 also includes a first optical element 728 for collecting light 706 emitted from a localized high intensity zone of a plasma, such as the plasma 508 of the plasma source of FIG. 5. In one embodiment, the light 706 emitted by the plasma source 500 is light having a wavelength shorter than about 5 nm for conducting X-ray microscopy. The light 706 collected by the first optical element 728 is then directed as light signal 732 towards a sample 708 (e.g., a biological sample) located on a substrate 704. Light 712 which passes through the sample 708 and the substrate 704 then passes through a second optical element 716. Light 720 passing through the second optical element (e.g., an image of the sample 728) is then directed onto an electromagnetic signal detector 724 imaging the sample 728.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A lithography system for semiconductor fabrication comprising:
    at least one light collection optic;
    at least one light condenser optic in optical communication with the at least one collection optic; and
    a light source capable of generating light for collection by the at least one collection optic comprising
        i. a chamber having a plasma discharge region and containing an ionizable medium,
        ii. a magnetic core that surrounds a portion of the plasma discharge region, and
        iii. a pulse power system for providing at least one pulse of energy to the magnetic core for delivering power to a plasma formed in the plasma discharge region that forms the secondary of a transformer according to Faraday's law of induction, wherein the plasma has a localized high intensity zone.

2. The lithography system of claim 1 wherein light emitted by the plasma is collected by the at least one collection optic, condensed by the at least one condenser optic and at least partially directed through a lithographic mask.

3. The lithography system of claim 1 wherein the plasma substantially varies in current density along a path of current flow in the plasma.

4. The lithography system of claim 1 wherein the zone is a point source of high intensity light.

5. The lithography system of claim 1 wherein the zone is a region where the plasma is pinched to form a neck.

6. The lithography system of claim 1 wherein a feature in the chamber creates the zone.

7. The lithography system of claim 1 wherein gas pressure creates the zone.

8. The lithography system of claim 1 wherein current flow in the plasma creates the zone.

9. The lithography system of claim 6 wherein the feature is configured to substantially localize an emission of light by the plasma.

10. The lithography system of claim 6 wherein the feature is located remotely relative to the magnetic core.

11. The lithography system of claim 6 wherein the feature defines a necked region for localizing an emission of light by the plasma.

12. The lithography system of claim 6 wherein the feature comprises a gas inlet.

13. The lithography system of claim 6 wherein the feature comprises cooling capability.

14. The lithography system of claim 13 wherein the cooling capability involves pressurized subcooled flow boiling of water.

15. The lithography system of claim 1 wherein the at least one pulse of energy provided to the magnetic core forms the plasma.

16. The lithography system of claim 1 wherein the pulse power system provides each pulse of energy at a frequency of between about 100 pulses per second and about 15,000 pulses per second.

17. The lithography system of claim 1 wherein each pulse of energy is provided for a duration of time between about 10 ns and about 10 µs.

18. The lithography system of claim 1 wherein the pulse power system comprises an energy storage device.

19. The lithography system of claim 18 wherein the energy storage device comprises at least one capacitor.

20. The lithography system of claim 1 wherein the pulse power system comprises a second magnetic core.

21. The lithography system of claim 20 wherein the second magnetic core discharges each pulse of energy to the first magnetic core to deliver power to the plasma.

22. The lithography system of claim 20 wherein inductive leakage current flowing from the second magnetic core to the magnetic core surrounding the portion of the plasma discharge region pre-ionizes the ionizable medium.

23. The lithography system of claim 1 wherein the pulse power system comprises a magnetic compression pulse generator.

24. The lithography system of claim 1 wherein the pulse power system comprises a magnetic switch for selectively delivering the pulse of energy to the magnetic core.

25. The lithography system of claim 1 wherein the pulse power system comprises a saturable inductor.

26. The lithography system of claim 1 wherein the magnetic core is configured to produce at least essentially a Z-pinch in a channel region located in the chamber.

27. The lithography system of claim 1 wherein the magnetic core is configured to produce at least essentially a capillary discharge in a channel region located in the chamber.

28. The lithography system of claim 1 further comprising at least one port for introducing the ionizable medium into the chamber.

29. The lithography system of claim 1 wherein the ionizable medium is at least one or more gases selected from the group consisting of Xenon, Lithium, Tin, Nitrogen, Argon, Helium, Fluorine, Ammonia, Stannane, Krypton and Neon.

30. The lithography system of claim 1 comprising an ionization source for pre-ionizing the ionizable medium.

31. The lithography system of claim 30 wherein the ionization source is a source selected from the group consisting of an ultraviolet lamp, an RF source, a spark plug and a DC discharge source.

32. The lithography system of claim 1 comprising an enclosure that at least partially encloses the magnetic core.

33. The lithography system of claim 32 wherein the enclosure defines a plurality of holes.

34. The lithography system of claim 33 wherein a plurality of plasma loops pass through the plurality of holes when the magnetic core delivers power to the plasma.

35. The lithography system of claim 32 wherein the enclosure comprises two parallel plates.

36. The lithography system of claim 35 wherein the parallel plates are conductive and form a primary winding around the core.

37. The lithography system of claim 32 wherein coolant flows through the enclosure for cooling a location adjacent the localized high intensity zone.

38. The lithography system of claim 32 wherein the enclosure comprises a material selected from the group consisting of copper, tungsten, aluminum and copper-tungsten alloys.

39. The lithography system of claim 1 wherein the plasma is a plasma loop that forms the secondary of a transformer according to Faraday's law of induction.

40. The lithography system of claim 6 wherein the feature is at least one aperture in a rotating disk.

41. The lithography system of claim 40 wherein a thin gas layer conducts heat from the disk to a cooled surface.

42. The lithography system of claim 1 wherein the light source is configured to produce light at wavelengths shorter than about 100 nm when the light source generates a plasma discharge.

43. A method for illuminating a semiconductor wafer in a lithography system comprising:
    introducing an ionizable medium capable of generating a plasma into a chamber;
    applying at least one pulse of energy to a magnetic core that surrounds a portion of a plasma discharge region within the chamber such that the magnetic core delivers power to the plasma that forms the secondary of a transformer according to Faraday's law of induction, wherein the plasma has a localized high intensity zone;
    collecting light emitted by the plasma;
    condensing the collected light; and
    directing at least part of the condensed light through a mask onto a surface of a semiconductor wafer.

44. A method for illuminating a semiconductor wafer in a lithography system comprising:
    introducing an ionizable medium capable of generating a plasma into a chamber;
    applying at least one pulse of energy to a magnetic core that surrounds a portion of a plasma discharge region within the chamber such that the magnetic core delivers power to the plasma that forms the secondary of a transformer according to Faraday's law of induction wherein the plasma has a localized high intensity zone;
    collecting light emitted by the plasma;
    condensing the collected light; and
    reflecting at least part of the condensed light off a mask onto a surface of a semiconductor wafer.

45. A lithography system for semiconductor fabrication comprising:
    at least one light collection optic;
    at least one light condenser optic in optical communication with the at least one collection optic; and
    a light source capable of generating light for collection by the at least one collection optic comprising
      i. a chamber having a plasma discharge region and containing an ionizable medium,
      ii. a magnetic core that surrounds a portion of the plasma discharge region, and
      iii. a means for providing at least one pulse of energy to the magnetic core for delivering power to a plasma formed in the plasma discharge region that forms the secondary of a transformer according to Faraday's law of induction, wherein the plasma has a localized high intensity zone.

46. The lithography system of claim 1 comprising two parallel conductive plates that form the conductive path around the magnetic core and the primary winding of the transformer.

47. The lithography system of claim 46 comprising a metal strip that forms the conductive path around the magnetic core and the primary winding of the transformer.

48. The lithography system of claim 1 wherein the power delivered to the plasma loop is based on a magnetic field produced by the magnetic core and frequency and duration of the pulses of energy delivered to the transformer.

49. The lithography system of claim 39 wherein the plasma loop surrounds the magnetic core.

* * * * *